United States Patent [19]
Inada et al.

[11] Patent Number: 5,567,674
[45] Date of Patent: Oct. 22, 1996

[54] PROCESS OF FORMING OXIDE SUPERCONDUCTOR POSSESSING LOCALLY DIFFERENT CRYSTAL ORIENTATIONS

[75] Inventors: Hiroshi Inada; Michitomo Iiyama, both of Osaka, Japan

[73] Assignee: Sumitomo Electric Industries, Ltd., Japan

[21] Appl. No.: 472,642

[22] Filed: Jun. 7, 1995

Related U.S. Application Data

[62] Division of Ser. No. 201,080, Feb. 24, 1994, Pat. No. 5,464,812, which is a continuation of Ser. No. 845,420, Mar. 4, 1992, abandoned.

[30] Foreign Application Priority Data

Mar. 4, 1991 [JP] Japan .................................. 3-62602
Mar. 4, 1991 [JP] Japan .................................. 3-62603

[51] Int. Cl.$^6$ ........................... H01L 39/24; C23C 14/34
[52] U.S. Cl. ..................... 505/475; 505/237; 505/238; 505/329; 505/731; 427/62; 427/63; 428/930; 204/192.24
[58] Field of Search ................... 505/237, 238, 505/475, 329, 731; 427/62, 63; 204/192.24; 428/930

[56] References Cited

U.S. PATENT DOCUMENTS

| | | | |
|---|---|---|---|
| 4,916,114 | 4/1990 | Hoenig | 505/1 |
| 4,942,142 | 7/1990 | Itozaki et al. | 505/1 |
| 4,960,751 | 10/1990 | Yamazaki | 505/1 |
| 5,024,894 | 6/1991 | Chien | 428/433 |
| 5,030,613 | 7/1991 | Chai | 505/1 |
| 5,047,385 | 9/1991 | Beasley et al. | 505/1 |
| 5,061,687 | 10/1991 | Takada et al. | 505/1 |
| 5,126,315 | 6/1992 | Nishino et al. | 505/1 |
| 5,326,745 | 7/1994 | Nishino et al. | 505/220 |

FOREIGN PATENT DOCUMENTS

| | | |
|---|---|---|
| 0324220 | 7/1989 | European Pat. Off. . |
| 0459905 | 12/1991 | European Pat. Off. . |
| 0476617 | 3/1992 | European Pat. Off. . |

OTHER PUBLICATIONS

Wu et al., J. Appl. Phys. 72(11) Dec. 1992, pp. 5337–5340.
Luo et al, Appl. Phys. Lett. 59(16), Oct. 1991, pp. 2043–2045.
Asano et al., Jpn. J. Appl. Phys. 28(6) Jun. 1989, pp. L981–L983.
"Dependence Of Crystalline Orientation On Film Thickness In Laser–Ablated $YBa_2Cu_3O_{7-\delta}$ On $LaAlO_3$," A. H. Carim, Appl. Phys. Lett. 58 (8), Feb. 25, 1991, pp. 871–873.
"Reaction Patterning Of $YBa_2Cu_3O_{7-\delta}$ Thin Films On Si," D. K. Fork et al., Appl. Phys. Lett. 57 (23), Dec. 3, 1990, pp. 2504–2506.
"Bi–Epitaxial Grain Boundary Junctions In $YBa_2Cu_3O_7$," K. Char et al., Appl. Phys. Lett.
"Extension Of The Bi–Epitaxial Josephson Junction Process To Various Substrates," K. Char et al., Appl. Phys. Lett. 59 (17), Oct. 21, 1991, pp. 2177–2179.

(List continued on next page.)

Primary Examiner—Roy V. King
Attorney, Agent, or Firm—Beveridge, DeGrandi, Weilacher & Young, L.L.P.

[57] ABSTRACT

A thin film of oxide superconductor consisting of more than two portions (1, 11, 12) each possessing a predetermined crystal orientation and deposited on a common surface of a substrate (2). At least one selected portion (10) of thin film of oxide superconductor is deposited on a thin under-layer (4, 100) which facilitates crystal growth of selected portions and which is deposited previously on the substrate. The selected portions (10) may consist of a-axis oriented thin film portions while non-selected portions (11, 12) may consists of c-axis oriented thin film portions. The thin under-layer can be a buffer layer (4) or a very thin film (100) of oxide superconductor.

15 Claims, 2 Drawing Sheets

OTHER PUBLICATIONS

A. H. Carim et al., "Dependence Of Crystalline Orientation On Film Thickness In Laser–Ablated $YBa_2Cu_3O_7-\delta$ On $LaAlO_3$", *Appl. Phys. Lett.*, vol. 58, No. 8, Feb. 25, 1991, pp. 871–873.

D. K. Fork et al., "Reaction Patterning Of $YBa_2Cu_3O_{7d}-\delta$ Thin Films On Si", Appl. Phys. Lett., vol. 57, No. 23, Dec. 3, 1990, pp. 2504–2506.

K. Char et al., "Bi–epitaxial Grain Boundary Junctions in $YBa_2Cu_3O_7$", *Appl. Phys. Lett.*, No. 6, Aug. 5, 1991, pp. 733–735.

Theodore H. Geballe, "Paths to Higher Temperature Superconductors", *Science*, vol. 259, Mar. 12, 1993, pp. 1550–1551.

James D. Doss, "Josephson Junctions and Weak Links," Engineer's Guide To High–Temperature Superconductivity; 1989, pp. 153–157.

Robert Pool, "Superconductors' Material Problems", Research News, *Science*, vol. 240, Apr. 1, 1988, pp. 25–27.

T. Venkatesan, "Processing Of Films For High $T_c$ Superconducting Electronics", SPIE, proceedings, vol. 1187, 1989, pp. 2–11.

David L. Nelson et al., "Chemistry Of High–Temperature Superconductors II", American Chemical Society, Washington D.C., 1988, pp. 1–9.

K. Char et al., "Extension Of The Bi–epitaxial Josephson Junction Process To Various Substrates", *Appl. Phys. Lett.*, vol. 59, No. 17, Oct. 21, 1991, pp. 2177–2179.

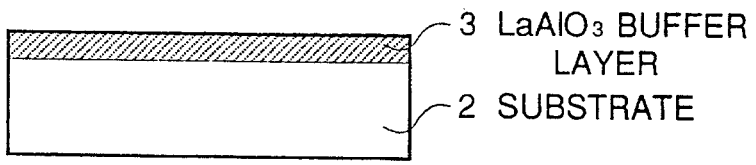
FIG. IA
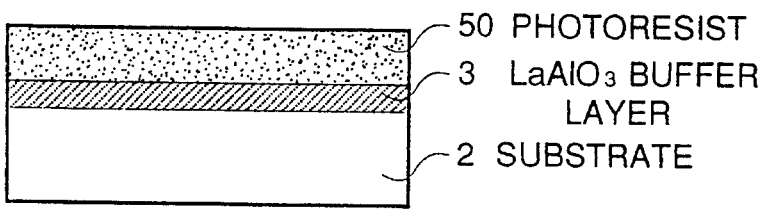
FIG. IB
FIG. IC
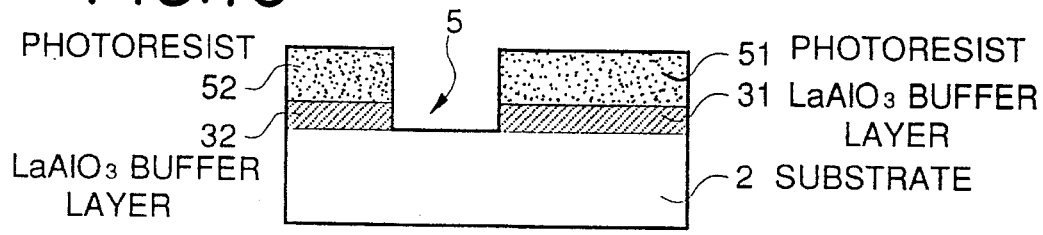
FIG. ID
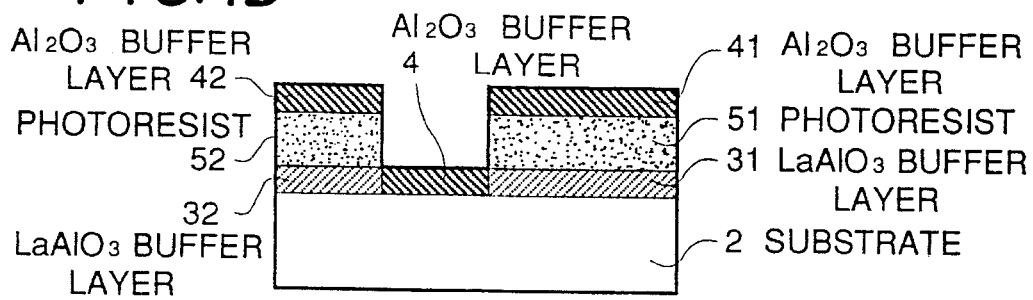
FIG. IE
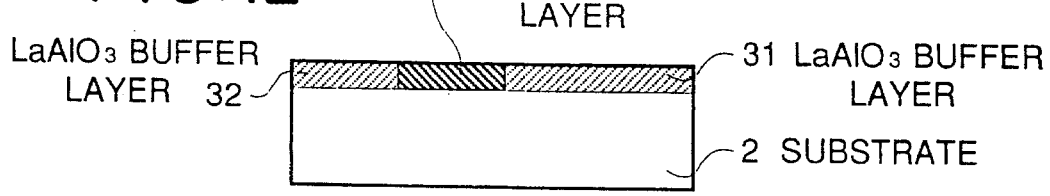
FIG. IF
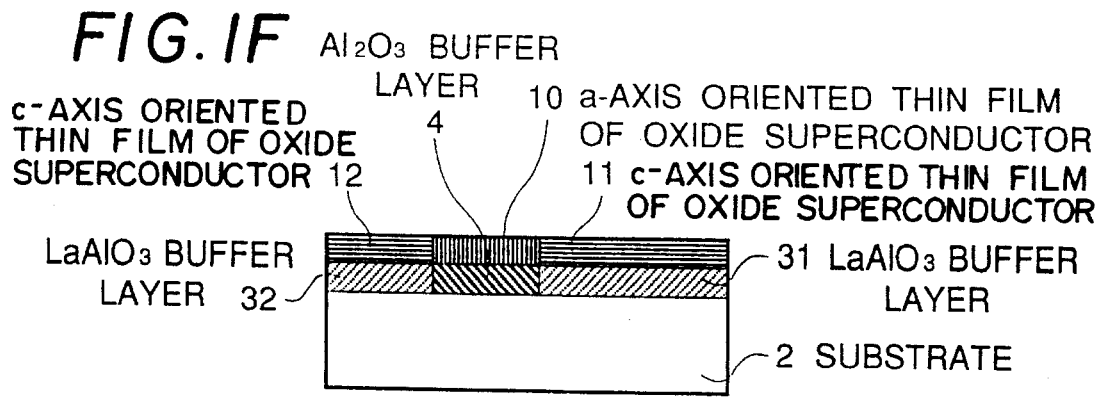

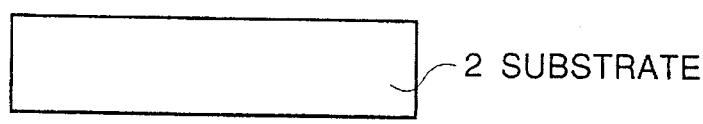
FIG. 2A
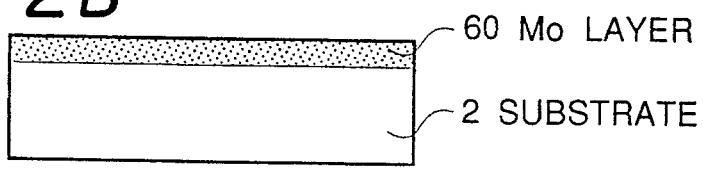
FIG. 2B
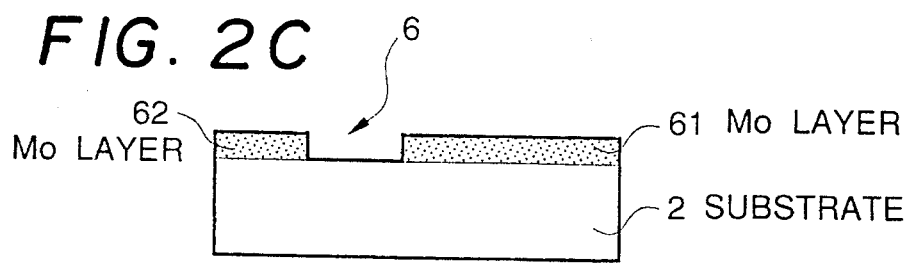
FIG. 2C
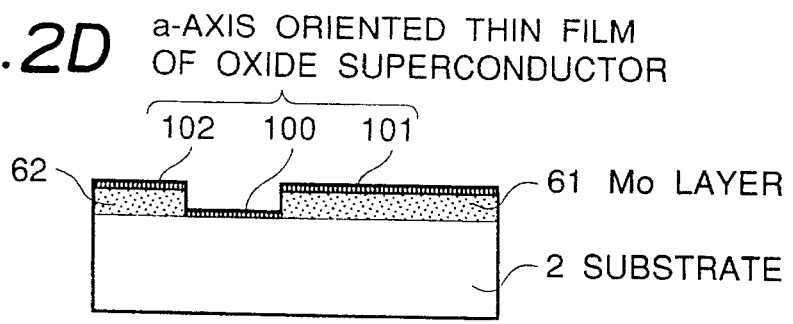
FIG. 2D  a-AXIS ORIENTED THIN FILM OF OXIDE SUPERCONDUCTOR
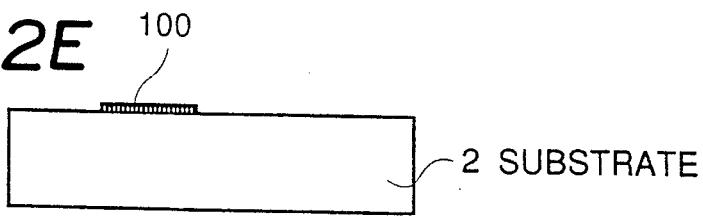
FIG. 2E
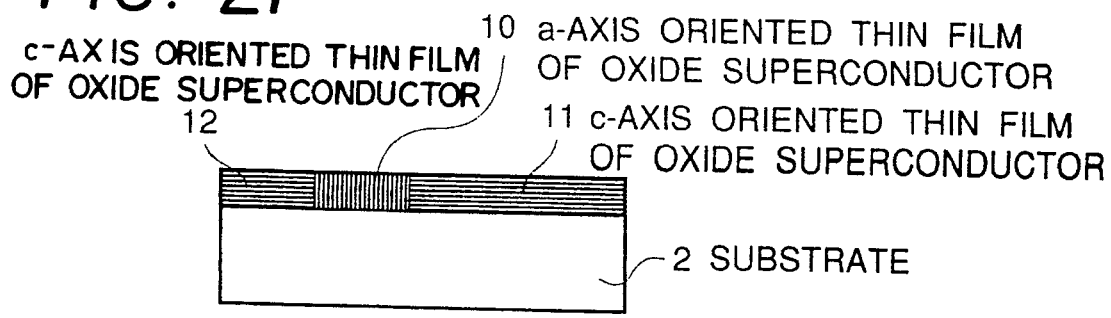
FIG. 2F 5,567,674

PROCESS OF FORMING OXIDE SUPERCONDUCTOR POSSESSING LOCALLY DIFFERENT CRYSTAL ORIENTATIONS

This application is a division of application Ser. No. 08/201,080 filed on Feb. 24. 1994 now U.S. Pat. No. 5,464,812 which is a continuation of Ser. No. 07/845,420 filed on Mar. 4, 1992 now abandoned, which is incorporated entirely herein by reference.

BACKGROUND OF THE INVENTION

1. Field of the Invention

The present invention relates to a thin film of oxide superconductor possessing locally different crystal orientations and more particularly to a process for producing a thin film of oxide superconductor having a-axis (or b-axis) oriented thin film portions and c-axis oriented thin film portions on a common substrate and processes for preparing the same.

2. Description of the Related Arts

Oxide superconductors are expected to be used in a variety applications due to their higher critical temperatures than conventional metal superconductors. In fact, Y-Ba-Cu-O oxide superconductors possess a critical temperature above 80 K and Bi-Sr-Ca-Cu-O and Tl-Ba-Ca-Cu-O oxide superconductors possess a critical temperature above 100 K. However, the oxide superconductors possess crystal anisotropy in their superconducting properties. In fact, the highest critical current density is observed in a direction which is perpendicular to the c-axis of their crystal. From this fact, the direction of crystal orientation must be considered in actual utilization of oxide superconductors.

In the oxide superconductors to which the present invention is applicable, a-axis, b-axis and c-axis of their crystals are determined and known. It is also known that electric current flows in a plane defined by the a-axis and the b-axis. In the specification, only a-axis oriented thin film is referred to because the difference between an a-axis oriented thin film and a b-axis oriented thin firm is not important from the view point of superconducting current flow. Orientation of these axes is usually defined by the direction of crystal axis with respect to a surface of the substrate. For example, "c-axis oriented thin film" means a thin film whose c-axis is perpendicular to the surface of substrate.

When the oxide superconductors are used in superconductor electronics for producing superconducting devices or integrated superconducting circuits, it is indispensable to prepare a thin film of the oxide superconductors. However, the problem of crystal anisotropy becomes critical in the thin films of oxide superconductors.

In addition to this, in order to realize high-performance superconducting devices or integrated superconducting circuits of high density, it is requested to prepare, on a common surface of substrate, two kinds of superconducting wiring lines: one in which electric current flows in parallel with a surface of substrate and another in which electric current flows perpendicular to the surface of substrate. For example, in superconducting electrodes, current flows usually in parallel with the surface of substrate, while in interlayer superconducting wiring lines connecting different layers stratified on the substrate, current must flow perpendicular to the surface of substrate. Therefore, when oxide superconductor is used in high-performance superconducting devices or integrated superconducting circuits of high density, it is requested to deposit, on a common surface a substrate, both a c-axis orientated thin film at oxide superconductor in which the critical current density along the direction which is in parallel with the surface of substrate is higher than the other directions, and an a-axis (or b-axis) orientated thin film oxide superconductor in which the critical current density along the direction which is perpendicular to the surface of substrate is higher than the direction of c-axis.

Crystal orientation of the thin film of oxide superconductor can be controlled by selecting a film-forming temperature which is determined usually by substrate temperature. In fact, the a-axis oriented thin film can be realized at a substrate temperature which is lower by about 50° to 100° C. than a substrate temperature which is preferable to prepare the c-axis oriented thin film. From this fact, in a known process for preparing a thin film having a-axis oriented thin film portions and c-axis oriented thin film portions in a common substrate, one of the thin film portions is deposited firstly on a surface of the common substrate, then selected areas of the firstly deposited thin film portions are removed by an etching technique to produce patterned first thin film portions and after that, another thin film portions are deposited on the selected area.

This known technique, however, is not effective in actual production because it is necessary to effect two deposition steps of two different thin films under different conditions. Still more, the dimension of superconducting wiring lines obtained is limited due to tolerance or precision of the etching operation, so that a cross section of a superconducting wiring line obtained becomes unnecessarily large, resulting in that it is difficult to increase the density of superconducting circuits. There is also such danger that the thin film of oxide superconductor obtained is contaminated at etched margins or non-superconductor deposit on the etched margins. Still more, when etching operation is not effected satisfactorily, for example, when a firstly deposited c-axis oriented thin film is not removed completely but is left, the next thin film deposited on the firstly deposited c-axis oriented thin film will not become an a-axis oriented thim film but becomes a c-axis oriented thin film. Even if the firstly deposited thin film can be removed completely, the resulting surface is often roughened due to delicate operational conditions of etching. In such case also, it is difficult to realize a well-ordered a-axis oriented thin film of high quality.

The known process has another problems. Namely, when a c-axis oriented thin film is deposited firstly and then an a-axis oriented thin film is deposited secondly, even if the etching operation is effected ideally oxygen atoms escape out of the margin of the c-axis oriented thin film which are exposed by the etching operation, so that the stoichiometry of the thin film is spoiled at the margins of the c-axis oriented thin film, resulting in deterioration of superconducting properties at the margins. In this case, after deposition of an a-axis oriented thin film is effected, it is impossible to re-supply oxygen atoms to the marginal area of the c-axis oriented thin film by conventional oxygen supply techniques such as heat treatment, because the marginal area is filled or closed with the a-axis oriented thin film and hence oxygen can't enter the c-axis oriented thin film due to such a fact that oxygen can enter only through the plane defined by a-axis and b-axis. Therefore, a the superconducting device obtained sometimes does not work.

Still more, in the known process, it is very difficult to realize a perfect or satisfactory interface between a c-axis oriented thin film deposited firstly and an a-axis oriented thin film deposited secondly, resulting in that the capacity of electric current at the interface is limited. And, a weak junction caused by the contamination at the etching operation is often produced at the interface between the a-axis oriented thin film and the c-axis oriented thin film, resulting in that the obtained superconducting device shows non-linear property due to a tunnel current.

An object of the present invention is to solve the problems of the known process and to provide an improved thin film of oxide superconductor possessing locally different crystal orientations and two processes for preparing the thin film.

SUMMARY OF THE INVENTION

The present invention provides a thin film of oxide superconductor consisting of more two portions each possessing a predetermined different crystal orientation and deposited on a common surface of a substrate, characterized in that at least one selected portion of the thin film is deposited on an under-layer which facilitates crystal growth of the selected portion and which is deposited previously on the substrate.

The selected portions may consist of a-axis oriented thin film portions while non-selected portions may consist of c-axis oriented thin film portions.

In a preferred first embodiment of the present invention, the thin under-layer can be buffer layer(s) and in a preferred second embodiment of the present invention, the thin under-layer can be a very thin film of oxide superconductor. Hereafter, these two preferred embodiments are described.

DESCRIPTION OF THE PREFERRED EMBODIMENTS

FIRST EMBODIMENT

In the first embodiment in which the thin under-layer is made of buffer layers, the thin film of oxide superconductor according to the present invention consists of first portions which are deposited on first buffer layer portions made of a material having such a crystal structure that a thin film of oxide superconductor whose c-axis is oriented along a direction which is perpendicular to the substrate is easily grown and of second portions which are deposited on second buffer layer portions made of a material having such a crystal structure that a third film of oxide superconductor whose c-axis is oriented along a direction which is in parallel to the substrate is easily grown.

The thin film of oxide superconductor according in the first embodiment is prepared by the steps of depositing a first buffer layer or said substrate, removing selected portions of said first buffer layer to expose a surface of said substrate, depositing a second buffer layer on the exposed surface, and then depositing a thin film of oxide superconductor on the first buffer layer portions remaining and on the second buffer layer.

The obtained thin film of oxide superconductor consists of c-axis oriented portions in which the c-axis of crystal is oriented along a direction which is perpendicular to the substrate and a-axis oriented portions in which the c-axis of crystal is oriented along a direction which is in parallel with the substrate, so that the directions of electric current can be selected according to respective uses of the thin film of oxide superconductor of which superconducting wiring lines, superconducting electrodes or the like are fabricated, resulting in that high-performance superconducting devices or integrated superconducting circuits can be realized.

The process of the first embodiment is applicable to any known oxide superconductor and is advantageously applicable to Y-Ba-Cu-O oxide superconductor, Bi-Sr-Ca-Cu-O oxide superconductor and Tl-Ba-Ca-Cu-O oxide superconductor which have the most attractive properties including the critical temperature.

The buffer layers to be deposited on the substrate are selected preferably in such a manner that the portion of the buffer layer on which c-axis oriented thin film of oxide superconductor is to be deposited is made of $LaAlO_3$, $PrGaO_3$ or the like, while the portion of the buffer layer on which a-axis oriented thin film of oxide superconductor is to be deposited is preferably made of $Al_2O_3$, MgO or the like. This is because the crystal lattice of $LaAlO_3$ $PrGaO_3$, or the like well-matches or is compatible with that of a-axis or b-axis oriented thin film of oxide superconductor to be deposited thereon and a c-axis oriented thin film of oxide superconductor can be grown easily on these buffer layers.

The thin film of oxide superconductor is preferably prepared at a substrate temperature in which c-axis oriented thin film of oxide superconductor grows. This is because a desired crystalline thin film can be obtained at higher substrate temperatures and growth of the c-axis oriented thin film of oxide superconductor requires a higher substrate temperature than that for the a-axis oriented thin film of oxide superconductor. In the process according to the present invention, both of the c-axis and a-axis oriented thin film portions of oxide superconductor grow spontaneously at the same substrate temperature.

SECOND EMBODIMENT

In the second embodiment in which the under-layer is made of a very thin film of oxide superconductor, the thin film of oxide superconductor according to the present invention consists of first portions whose c-axis of crystal is in parallel with a surface of a substrate at a selected area of the surface and second portions whose c-axis of crystal is perpendicular to the surface at a second selected area of the surface, the first portions being deposited on a very thin under-film layer of oxide superconductor whose c-axis of crystal is in parallel with the surface and which is deposited previously on the substrate with the second portions being deposited directly on the substrate.

The thin film of oxide superconductor of the second embodiment can be prepared by the steps of protecting or covering the second selected area of the surface with a sublimatable metal having a higher sublimation temperature than a film forming temperature of the the second portions, depositing a very thin under-film layer of oxide superconductor whose c-axis of crystal is in parallel with the surface whole over the first and second area, elevating a substrate temperature to sublimate the metal in order to remove parts of the under-film layer together with the metal so as to expose the second selected area of the substrate and then, depositing a thin film of oxide superconductor on the under-film layer at the first area and on the second area exposed under such a condition that is suitable to effect growth of a c-axis oriented thin film of oxide superconductor.

An essence of the second embodiment resides in that a very thin under-layer of oxide superconductor whose c-axis of crystal is in parallel with the surface is deposited firstly on the first selected area and then deposition of a thin film of oxide superconductor is carried out under such condition that c-axis of the thin film of oxide superconductor grows along a direction which is perpendicular to the surface.

The very thin under-layer of oxide superconductor can be made of the same material as the thin film which is deposited finally.

It is confirmed that the a-axis oriented thin film of oxide superconductor grows on the very thin under-layer of a-axis oriented oxide superconductor which is deposited previously even under a condition where a-axis of the thin film of oxide superconductor usually grows along a direction which is in parallel with the surface. Therefore, the thin film obtained possesses both first portions whose c-axis of crystal is in parallel with a surface of the substrate at a first selected area of the surface and second portions whose c-axis of crystal is perpendicular to the surface at a second selected area of the surface. Therefore, the directions of electric current can be selected according to respective uses of the thin film of oxide superconductor of which superconducting wiring lines, superconducting electrodes or the like are fabricated, so that high-performance superconducting devices or integrated superconducting circuits can be realized.

The very thin under-layer of oxide superconductor has preferably a thickness of less than about 50 nm corresponding to a thickness where an a-axis oriented thin film of oxide superconductor changes from cluster growth to a film growth.

The sublimatable metal can be Mo. In oxygen containing atmosphere at about 790° C., Mo changes to $MoO_3$ which sublimates. Mo gives no or little bad influence to the thin film of oxide superconductor.

The substrate is preferably MgO, $PrGaO_3$ or the like.

The process according to the second embodiment is also applicable to any known oxide superconductor and is advantageously applicable to Y-Ba-Cu-O oxide superconductor, Bi-Sr-Ca-Cu-O oxide superconductor and Tl-Ba-Ca-Cu-O oxide superconductor which have the most attractive properties including the critical temperature.

In he processes according to the present invention, a thin film of oxide superconductor possessing locally different crystal orientations can be realized easily by a single step of deposition, and the superconducting properties of the superconducting oxide thin film are not spoiled because the thin film is not subjected to undesirable operations.

The thin film of oxide superconductor prepared by the processes according to the present invention possesses locally different crystal orientations whose interfaces have good condition and hence shows improved superconducting properties which are requested for realizing superconducting devices or integrated superconducting circuits.

Now, the present invention will be described with reference to Examples but the scope of the invention should not be limited thereto.

BRIEF DESCRIPTION OF THE DRAWINGS

FIGS. 1A to 1F illustrates successive steps of the first embodiment according to the present invention.

FIGS. 2A to 2F illustrate successive steps of the second embodiment according to the present invention.

DESCRIPTION OF THE PREFERRED EMBODIMENTS

EXAMPLE 1

A thin film of $Y_1Ba_2Cu_3O_{7-x}$ having a-axis orient ad portions and c-axis oriented portions on a common surface of MgO substrate is made by a process according to the first embodiment of the present invention.

The process according to the present invention will be described with reference to an attached drawing.

At first, a buffer layer (3) of $LaAlO_3$ having a thickness of about 200 nm is deposited firstly on a substrate (2) as is show n in FIG. 1A by sputtering. The substrate (2) is preferably a insulator such as MgO (100), $SrTiO_3$, $CdNAlO_4$ or the like or of semiconductor such as silicon. The buffer layer (3) can be also of $PrGaO_3$. A photo-resist layer (50) is formed on a surface of the buffer layer (3) as is shown in FIG. 1B. When $LaAlO_3$ is selected as the buffer layer (3), selected portions of the buffer layer (3) at which a-axis oriented thin film of oxide superconductor is to be deposited is removed by a patterning process. FIG. 1C shows a patterned photo-resist layer having remained photo-resist area (51, 52). Then, the patterned photo-resist layer is subjected to ion milling or reactive ion etching operation to remove non-protected portion (5) of the buffer layer (3) until a surface of the substrate (2) is exposed between adjacent two buffer layer portions (31, 32) protected by the photo-resist area (51, 52). Then, another buffer layer (4) of $Al_2O_3$ is deposited up to the same thickness as the adjacent buffer layer portions (31, 32) as is shown FIG. 1D. The buffer layer $Al_2O_3$ may be replaced by a buffer layer of MgO. Then, layers (41, 42) of $Al_2O_3$ deposited on the photo-resist area (51, 52) are removed by a lift-off technique of the latter so that the buffer layer portions (31, 32) are exposed as is shown in FIG. 1E. In this case, if necessary, side walls can be eliminated by a side-etching technique. Removal of portions of the buffer layer (3) can be effected by other known techniques. For example, a hole of non-protected portion (5) of the buffer layer (3) is filled with suitable material and then the whole surface of deposited layers are subjected to an etch-back operation. After the buffer layer portions (31, 32) are exposed as is shown in FIG. 1E, the whole surface of exposed buffer layer portions (31, 32) of $LaAlO_3$ and of buffer layer (4) of $Al_2O_3$ is subjected to a cleaning operation which can be carried out by irradiating the whole surface with a slant ion shower (in which an axis of ion shower makes an acute angle with respect to the surface). Finally, as is shown in FIG. 1F, a thin film of oxide superconductor is deposited on the buffer layers (31, 32) of $LaAlO_3$ and on a buffer layer (4) of $Al_2O_3$ by known techniques such as off-axis sputtering, reaction-evaporation, molecular beam epitaxy (MBE) or chemical vapour deposition (CVD), so that c-axis oriented thin film portions (11, 12) are grown on the buffer layer portions (31, 32) of $LaAlO_3$, while an a-axis oriented thin film portion (10) is grown on the buffer layer (4) of $Al_2O_3$. The off-axis sputtering is carried out for example under the following operational conditions:

| Sputtering gas | |
|---|---|
| Ar | 90% |
| $O_2$ | 10% |
| Pressure | 10 Pa |
| Substrate temperature | 650 to 700° C. |

EXAMPLE 2

A thin film of $Y_1Ba_2Cu_3O_{7-x}$ having a-axis oriented portions and c-axis oriented portions on a common surface of $PrGaO_3$ substrate as is shown in FIG. 2A is made by a process according to the second embodiment of the present invention.

At first, a layer (60) of Mo having a thickness of about 100 nm in deposited firstly on a substrate (2) as is shown in FIG.

2B by electron beam evaporation or CVD. The substrate (2) of PrGaO₃ can be replaced by an insulator which is preferably MgO (100), SrTiO₃ (100), CdNdAlO₄ (001) or the like or by semiconductor such as silicon having a buffer layer. Then, a selected portion (6) of the Mo layer (60) is subjected to argon ion milling or reactive ion etching until a surface of the substrate (2) is exposed while a pattern (61, 62) of the Mo layer is left (FIG. 2C). Then, a very thin a-axis oriented film (100, 101, 102) of oxide superconductor is deposited (FIG. 2D). This a-axis oriented thin film of oxide superconductor can be prepared by off-axis sputtering under following operational conditions:

| Sputtering gas | |
| --- | --- |
| Ar | 90% |
| O₂ | 10% |
| Pressure | 10 Pa |
| Substrate temperatue | 600 to 650° C. |

Then, the substrate (2) is heated to a temperature between 800° and 850° C. at which the remaining Mo layers (61, 62) are sublimated, so that a-axis oriented film portions (101, 102) of oxide superconductor deposited on the patterned Mo Layer (61, 62) are also removed and a surface of the substrate (2) is exposed except a portion (100) of the a-axis oriented film of oxide superconductor left as is shown in FIG. 2E. Then, the substrate (2) is heated to a temperature between 700° and 750° C. which is a suitable to grow a c-axis oriented thin film of oxide superconductor. Then, a thin film of oxide superconductor is deposited (FIG. 2F). This thin film of oxide superconductor can be prepared by off-axis sputtering under following operational conditions:

| Sputtering gas | |
| --- | --- |
| Ar | 90% |
| O₂ | 10% |
| Pressure | 10 Pa |
| Substrate temperature | 700 to 750° C. |

The resulting thin film) of oxide superconductor possesses a-axis oriented thin film portion (10) grown on the portion (1000) of the a-axis oriented film of oxide superconductor left and c-axis oriented thin film-portions (11, 12) grown on the exposed portion of the substrate (2).

We claim:

1. A process for preparing a film of oxide superconductor having a first portion and a second portion, each of the portions possessing a different crystal orientation, the process comprising:

depositing a first buffer layer on a substrate, removing a portion of the first buffer layer to expose a surface of the substrate, depositing a second buffer layer on the exposed surface of the substrate, and depositing a film of oxide superconductor on a remaining portion of the first buffer layer and on the second buffer layer, such that a first portion of the film of oxide superconductor on the first buffer layer has a first crystal orientation, and a second portion of the film of oxide superconductor on the second buffer layer has a second crystal orientation, one of the crystal orientations being a c-axis crystal orientation.

2. The process set forth in claim 1 wherein the first portion of the film of oxide superconductor has the c-axis crystal orientation, while the second portion of the film of oxide superconductor has an a-axis crystal orientation.

3. The process set forth in claim 1 wherein said first buffer layer is formed of LaAlO₃ or PrGaO₃.

4. The process set forth in claim 1 wherein said buffer layers have a thickness of about 200 nm.

5. The process set forth in claim 1, wherein said substrate is formed of MgO, SrTiO₃, CdNdAlO₄ or a semiconductor material.

6. The process set forth in claim 1, wherein said said second buffer layer portion is formed of Al₂O₃ or MgO.

7. The process set forth in claim 1, wherein the film of oxide superconductor is formed of a Y-Ba-Cu-O oxide superconductor, a Bi-Sr-Ca-Cu-O oxide superconductor, or a Tl-Ba-Ca-Cu-O oxide superconductor.

8. A process for preparing a film of oxide superconductor portion over a first selected area of a surface of a substrate, and a second portion over a second selected area of the surface of the substrate, one of said portions having a c-axis crystal orientation, the process comprising:

covering the second selected area with a sublimatable metal having a higher sublimation temperature than an oxide superconductor film forming temperature of the second portion, depositing an under-film layer of oxide superconductor having an a-axis or b-axis crystal over at least the first selected area of the surface, elevating a substrate temperature to sublimate the metal so as to remove any of the under-film layer deposited over the second selected area, and depositing a film of oxide superconductor over the first and second selected areas under conditions that are suitable to effect growth of a film of oxide superconductor having a c-axis crystal orientation.

9. The process set forth in claim 8, wherein the sublimatable metal is Mo.

10. The process set forth in claim 8, wherein the substrate is heated to about 790° C. to sublimate the metal.

11. The process set forth in claim 8, wherein the film of oxide superconductor is deposited by off-axis sputtering.

12. The process set forth in claim 8, wherein the film of oxide superconductor is formed of a Y-Ba-Cu-O oxide superconductor, a Bi-Sr-Ca-Cu-O oxide superconductor, or a Tl-Ba-Ca-Cu-O oxide superconductor.

13. The process set forth in claim 8, wherein the under-film layer has a thickness of less then about 50 nm.

14. The process set forth in claim 8, wherein the substrate is formed of MgO or PrGaO₃.

15. The process set forth in claim 8, wherein the second selected area is covered with a layer of sublimatable metal having a thickness of about 100 nm.

\* \* \* \* \*